US012765187B2

(12) United States Patent
Ke

(10) Patent No.: US 12,765,187 B2
(45) Date of Patent: Oct. 13, 2026

(54) DISPLAY PANEL

(71) Applicant: Wuhan China Star Optoelectronics Semiconductor Display Technology Co., Ltd., Wuhan (CN)

(72) Inventor: Linbo Ke, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 459 days.

(21) Appl. No.: 17/293,528

(22) PCT Filed: Mar. 30, 2021

(86) PCT No.: PCT/CN2021/084052
§ 371 (c)(1),
(2) Date: Nov. 25, 2023

(87) PCT Pub. No.: WO2022/193363
PCT Pub. Date: Sep. 22, 2022

(65) Prior Publication Data

US 2024/0130173 A1 Apr. 18, 2024

(30) Foreign Application Priority Data

Mar. 17, 2021 (CN) ......................... 202110284789.8

(51) Int. Cl.

| | |
|---|---|
| ***H10K 59/124*** | (2023.01) |
| ***H10K 59/121*** | (2023.01) |
| *H10D 86/40* | (2025.01) |
| *H10D 86/60* | (2025.01) |

(52) U.S. Cl.
CPC ....... *H10K 59/124* (2023.02); *H10K 59/1213* (2023.02); *H10D 86/411* (2025.01); *H10D 86/425* (2025.01); *H10D 86/60* (2025.01)

(58) Field of Classification Search
CPC ..................................................... H10W 99/00
See application file for complete search history.

(56) References Cited

U.S. PATENT DOCUMENTS

2018/0033891 A1* 2/2018 Pu ...................... H10D 30/6734

FOREIGN PATENT DOCUMENTS

| | | | |
|---|---|---|---|
| CN | 106024639 A * | 10/2016 | ......... H10D 30/0321 |
| CN | 106803510 A | 6/2017 | |
| CN | 106876386 A * | 6/2017 | ............. H10D 89/00 |
| CN | 107452756 A | 12/2017 | |
| CN | 108615822 A | 10/2018 | |
| CN | 109285964 A | 1/2019 | |
| CN | 110649044 A | 1/2020 | |

(Continued)

*Primary Examiner* — Jacob Y Cho
*Assistant Examiner* — Gabriel Sebastian Minney
(74) *Attorney, Agent, or Firm* — Nathan & Associates; Menachem Nathan

(57) ABSTRACT

The present invention provides a display panel. The display panel includes a substrate, a thin-film transistor layer, and at least one first annular retaining wall. The first annular retaining wall prevents an oxide semiconductor layer from intrusion of water, oxygen, etc. by configuring the first annular retaining wall to surround the oxide semiconductor layer of a second thin-film transistor, thereby protecting excellent electrical characteristics of devices while significantly enhancing reliability of thin-film transistors.

7 Claims, 5 Drawing Sheets

(56) References Cited

FOREIGN PATENT DOCUMENTS

| | | | | |
|---|---|---|---|---|
| CN | 110993655 | A | 4/2020 | |
| CN | 112397565 | A | 2/2021 | |
| CN | 212571000 | U | 2/2021 | |
| EP | 3174097 | A1 * | 5/2017 | ........... H10D 86/441 |
| JP | 2004327539 | A | 11/2004 | |
| KR | 20130022450 | A | 3/2013 | |
| WO | 2018180617 | A1 | 10/2018 | |

* cited by examiner

DISPLAY PANEL

FIELD OF INVENTION

The present invention is related to the field of display technology and specifically to a display panel.

BACKGROUND OF INVENTION

Low-temperature polycrystalline oxide (LTPO), which integrates low-temperature polycrystalline silicon (LTPS) thin-film transistors (TFTs) and oxide TFTs in a same panel, is a low-power consumption organic light-emitting diode (OLED). The LTPO TFTs have lower driving power than the LTPS TFTs. When a still image is displayed, LTPS needs to operate at 60 Hz, but can be reduced to 1 Hz with LTPO, which greatly reduces so driving power. LTPO converts part of transistors into oxides, which can reduce leakage current and maintain capacitor voltage (charge) for one second to operate at 1 Hz. Leakage current of LTPS is more, and it needs to operate at 60 Hz even when driving still pixels. Otherwise, brightness of LTPS will be severely decreased, but not LTPO. Therefore, LTPO products with lower power consumption are more and more sought after by people.

SUMMARY

Technical Problem

Compared with LTPS, manufacturing LTPO requires more layer structures. A conventional LTPO display device includes low-temperature polycrystalline silicon and oxide TFT device structures. Manufacturing processes thereof have problems of complicated manufacturing processes, low reliability, and a large number of photomasks. Meanwhile, an operating characteristic of the oxide TFTs is that they are very sensitive to surrounding atmosphere, such as oxygen, moisture, and hydrogen content. For example, a threshold voltage shift in the oxide TFTs caused by intrusion of water and oxygen will causes the oxide TFTs to fail.

Solution to Technical Problem

Technical Solution

The present invention provides a display panel disposing a first annular retaining wall surrounding an oxide semiconductor layer of a second thin-film transistor to protect the oxide semiconductor layer from intrusion of water, oxygen, etc.

In order to achieve the above purpose, the present invention provides a display panel including: a substrate; a thin-film transistor layer disposed on the substrate and including a first thin-film transistor and a second thin-film transistor, wherein the second thin-film transistor includes an oxide semiconductor layer; and at least one first annular retaining wall surrounding the oxide semiconductor layer.

Furthermore, the display panel further includes a first insulating layer disposed on the substrate.

The oxide semiconductor layer and the first annular retaining wall are disposed in a same layer on the first insulating layer. A material of the oxide semiconductor layer and a material of the first annular retaining wall are same.

Furthermore, a cross-sectional shape of the first annular retaining wall is a symmetrical figure including a square shape, a circular shape, or a petal shape.

Furthermore, a height of the first annular retaining wall is greater than or equal to a height of the oxide semiconductor layer.

Furthermore, the first thin-film transistor includes a low-temperature polycrystalline silicon semiconductor layer. The display panel further includes: a buffer layer disposed on the substrate, wherein the low-temperature polycrystalline silicon semiconductor layer is disposed on the buffer layer; and at least one second annular retaining wall surrounding the low-temperature polycrystalline silicon semiconductor layer.

Furthermore, the low-temperature polycrystalline silicon semiconductor layer and the second annular retaining wall are disposed in a same layer on the buffer layer. A material of the low-temperature polycrystalline silicon semiconductor layer and a material of the second annular retaining wall are same.

Furthermore, the display panel further includes: a gate insulating layer disposed on the buffer layer and covering the low-temperature polycrystalline silicon semiconductor layer and the second annular retaining wall; and a first gate layer disposed on the gate insulating layer and covered by the first insulating layer. The first insulating layer is disposed between the first gate layer and the oxide semiconductor layer.

Furthermore, the display panel further includes: a second insulating layer disposed on the first insulating layer; a third insulating layer disposed on the oxide semiconductor layer; and a second gate layer disposed on the third insulating layer, wherein the second gate layer, the oxide semiconductor layer, and the first annular retaining wall are covered by the second insulating layer.

Furthermore, the display panel further includes: a first source/drain layer disposed on the second insulating layer and penetrating the second insulating layer, the first insulating layer, and part of the gate insulating layer down to an upper surface of the low-temperature polycrystalline silicon semiconductor layer; a second source/drain layer disposed on the second insulating layer and penetrating part of the second insulating layer to connect to the oxide semiconductor layer; and a passivation layer disposed on the second insulating layer and covering the first source/drain layer and the second source/drain layer.

Furthermore, the display panel further includes: a first light-shielding layer disposed on the substrate and covered by the buffer layer; and a second light-shielding layer disposed on the gate insulating layer and covered by the first insulating layer.

ADVANTAGES OF INVENTION

Advantages of Invention

Beneficial Effect

The display panel provided by the present invention configures the first annular retaining wall to surround the oxide semiconductor layer of the second thin-film transistor. The first annular retaining wall prevents the oxide semiconductor layer from intrusion of water, oxygen, etc., thereby protecting excellent electrical characteristics of devices while significantly enhancing reliability of thin-film transistors. In addition, when forming the oxide semiconductor layer and the first annular retaining wall, the material of the first annular retaining wall is configured to be same as the material of the oxide semiconductor layer. The first annular retaining wall and the oxide semiconductor layer are formed by a same photomask, which does not add other photomasks to a new structure, and thus does not increase excess costs.

BRIEF DESCRIPTION OF DRAWINGS

Description of Drawings

The following describes specific embodiments of the present invention in detail with reference to the accompanying drawings, which will make technical solutions and other beneficial effects of the present invention obvious.

Figure 1:
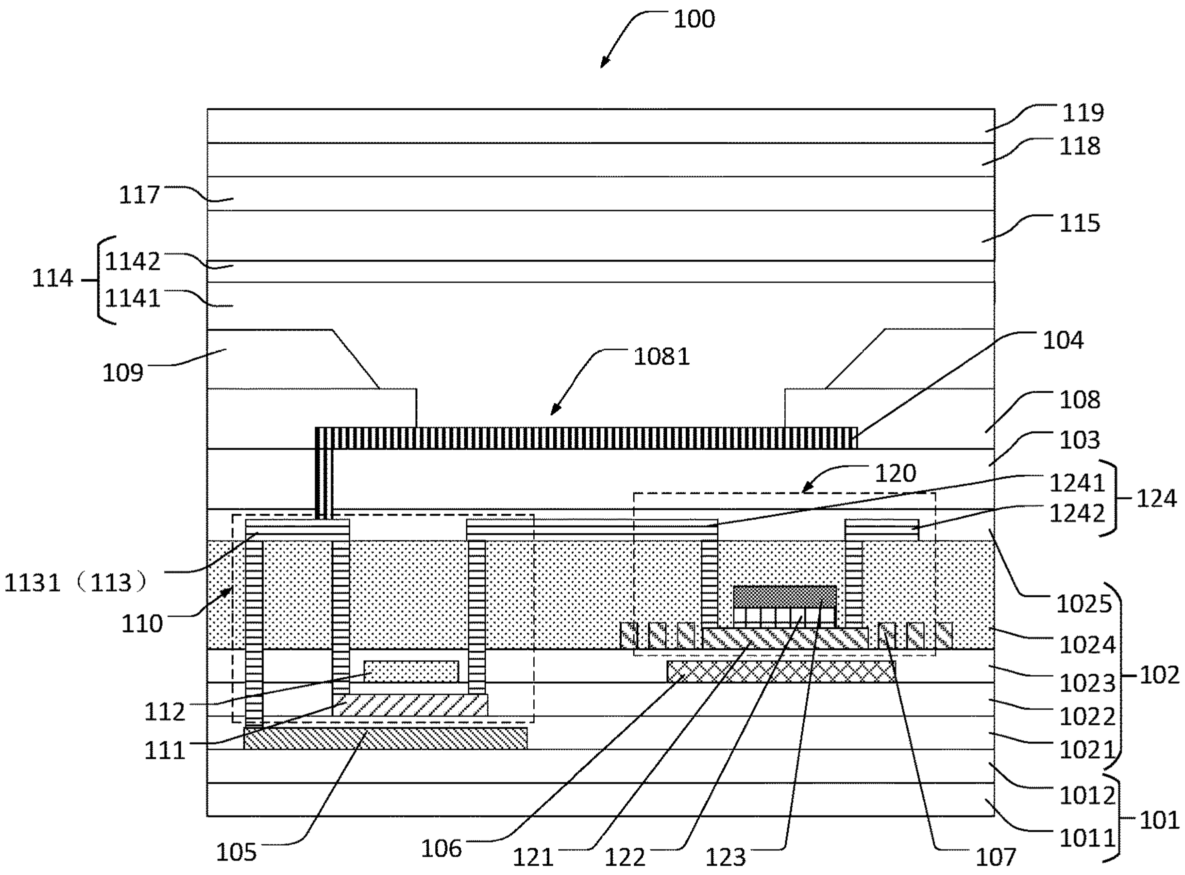

FIG. 1 is a structural schematic diagram of a display panel provided by a first embodiment of the present invention.

Figure 2:
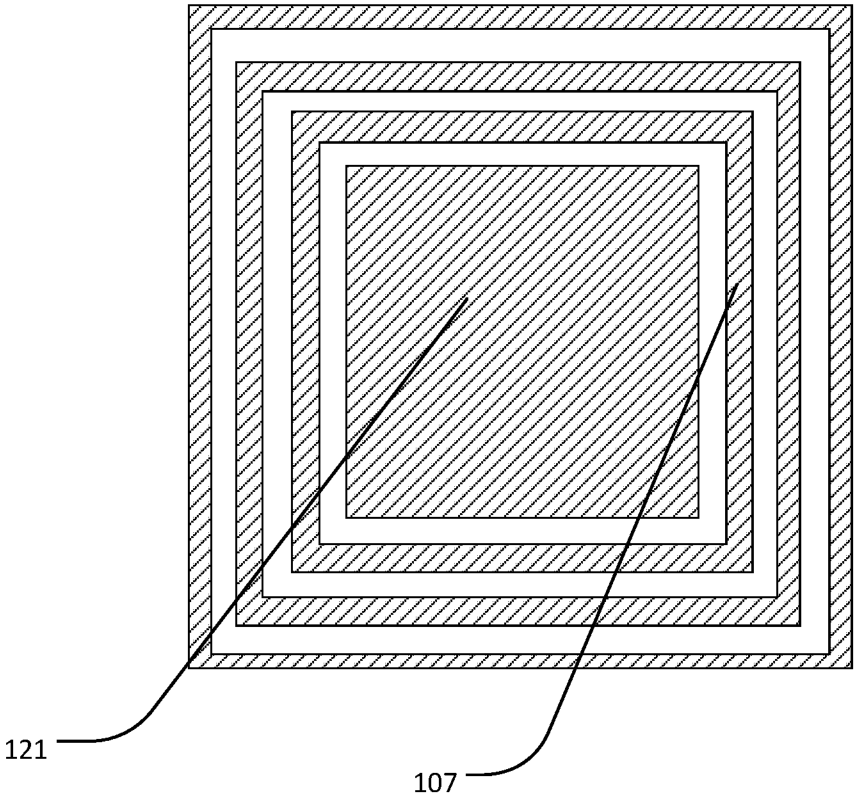

FIG. 2 is a plan view of a first annular retaining wall having a square shape provided by the first embodiment of the present invention.

Figure 3:
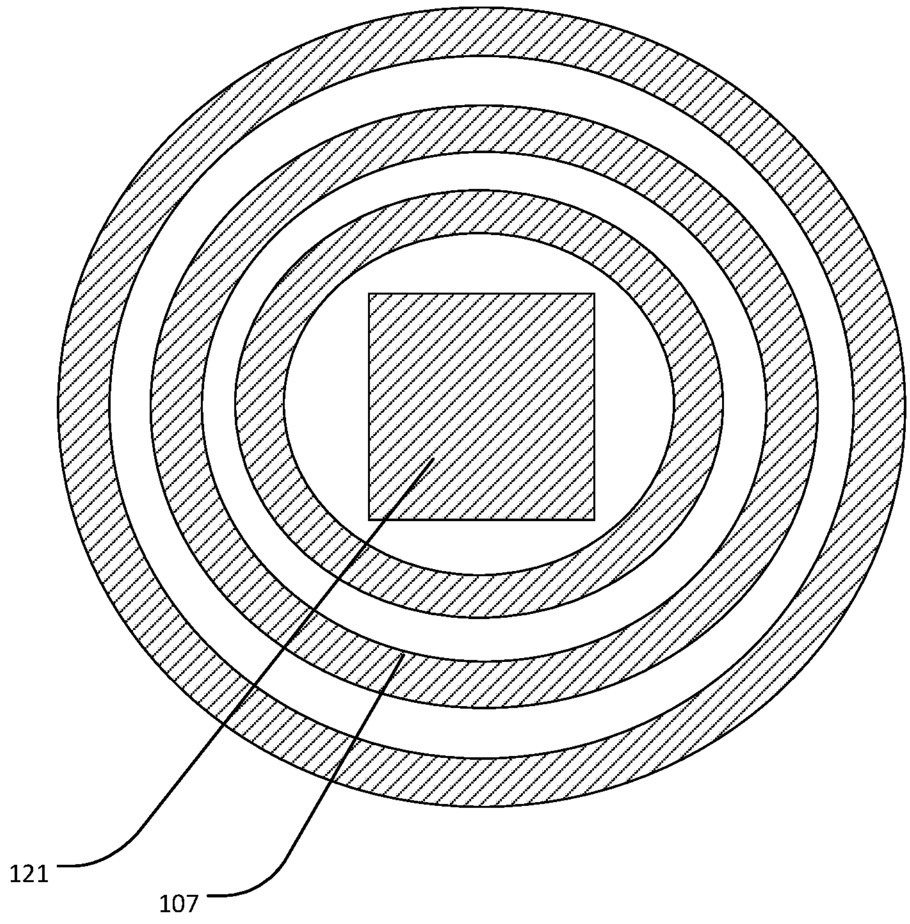

FIG. 3 is a plan view of the first annular retaining wall having a circular shape provided by the first embodiment of the present invention.

Figure 4:
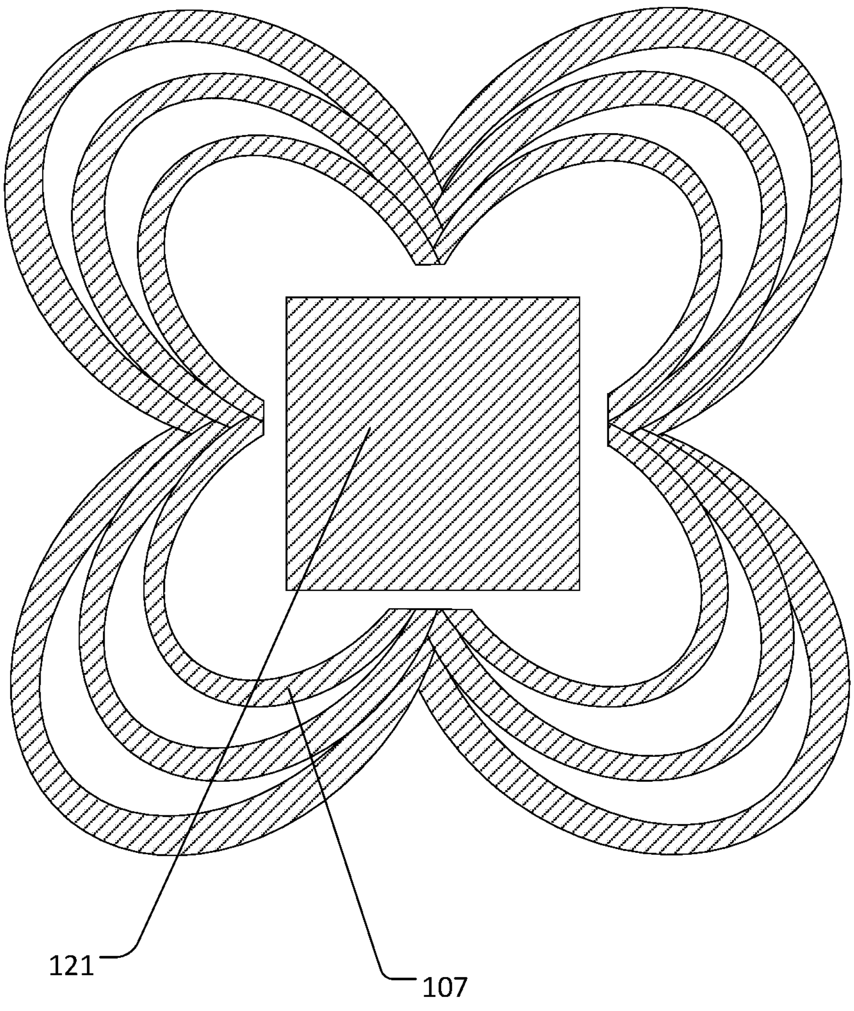

FIG. 4 is a plan view of the first annular retaining wall having a petal shape provided by the first embodiment of the present invention.

Figure 5:

FIG. 5 is a structural schematic diagram of an encapsulation layer provided by the first embodiment of the present invention.

Figure 6:

FIG. 6 is a structural schematic diagram of a polarizer provided by the first embodiment of the present invention.

Figure 7:
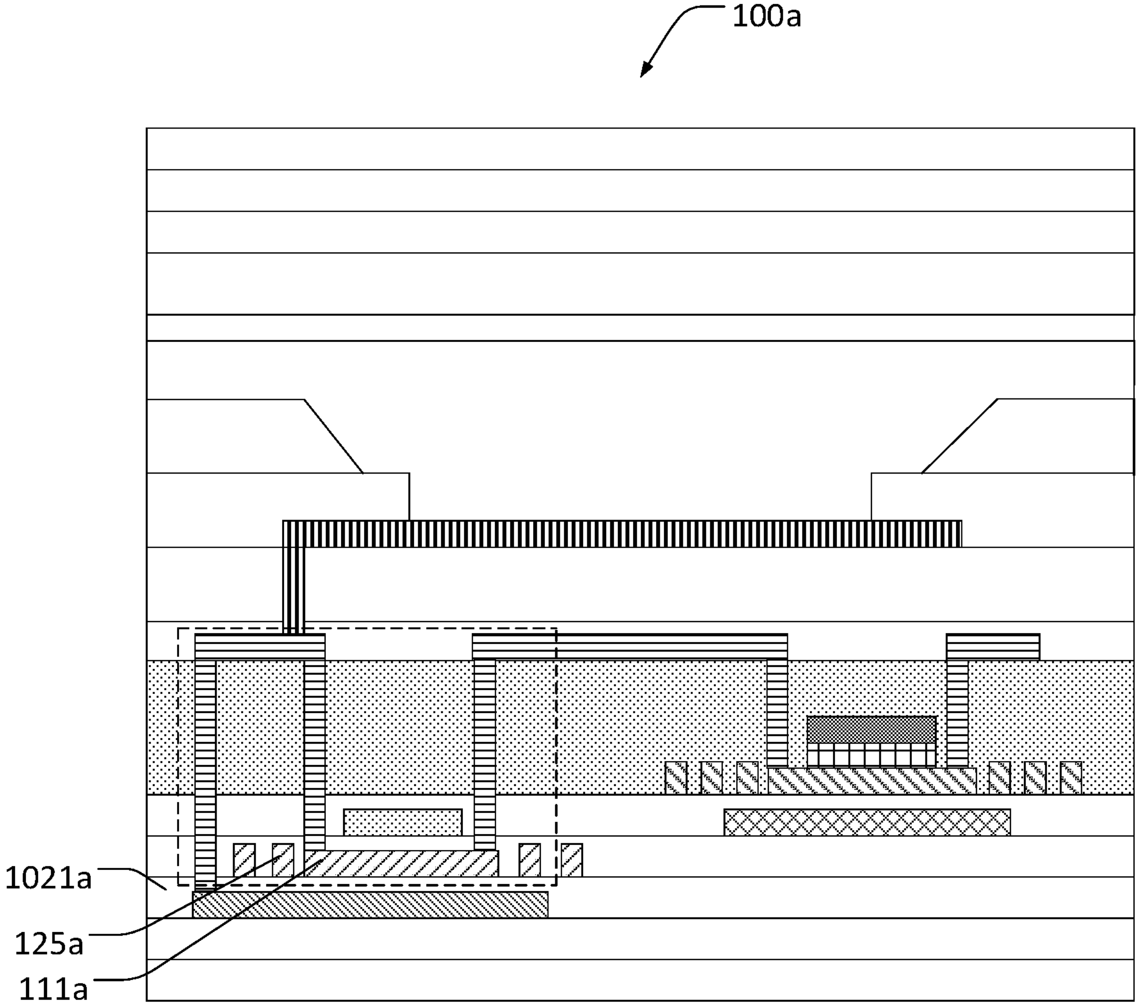

FIG. 7 is a structural schematic diagram of a display panel provided by a second embodiment of the present invention.

REFERENCE SIGNS display panel 100/100*a*, substrate 101, thin-film transistor layer 102, first annular retaining wall 107, first light-shielding layer 105, second light-shielding layer 106, planarization layer 103, pixel defining layer 108, support layer 109, display functional layer 114, encapsulation layer 115, touch layer 117, polarizer 118, cover glass 119, flexible substrate 1011, barrier layer 1012, buffer layer 1021, gate insulating layer 1022, first insulating layer 1023, second insulating layer 1024, passivation layer 1025, first thin-film transistor 110, second thin-film transistor 120, low-temperature polycrystalline silicon semiconductor layer 111, first gate layer 112, first source/drain layer 113, metal electrode trace 1131, oxide semiconductor layer 121, third insulating layer 122, second gate layer 123, second source/drain layer 124, first electrode trace 1241, second electrode trace 1242, first inorganic layer 1151, organic layer 1152, second inorganic layer 1153, first TAC layer 1181, PVA layer 1182, second TAC layer 1183, second annular retaining wall 125*a*, slot 1081, and first electrode 104.

EMBODIMENTS OF INVENTION

Detailed Description of Preferred Embodiments

Specific structures and functional details disclosed herein are only representative and are used for a purpose of describing exemplary embodiments of the present invention. However, the present invention can be implemented in many alternative forms and should not be construed as being limited only to embodiments set forth herein.

In the description of the present invention, it should be explained that the terms "center", "portrait", "transverse", "length", "width", "thickness", "upper", "lower", "front", "back", "left", "right", "vertical", "horizontal", "top", "bottom", "inside", "outside", etc. are based on the drawings. The orientation or positional relationship is only for the convenience of describing the present invention and simplifying the description, and does not indicate or imply that the device or element referred to must have a specific orientation, structure and operation in a specific orientation, and should not be viewed as limitations of the present invention. In addition, terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present invention, the meaning of "multiple" is two or more, unless specifically defined otherwise. Moreover, the term "include" and any variant thereof mean to cover the non-exclusive inclusion.

As shown in FIG. 1, the present invention provides a display panel 100. The display panel 100 includes a substrate 101, a thin-film transistor 102, and at least one first annular retaining wall 107.

The thin-film transistor layer 102 is disposed on the substrate 101. The thin-film transistor layer 102 includes a first thin-film transistor 110 and a second thin-film transistor 120. The at least one first annular retaining wall 107 surrounds an oxide semiconductor layer 121 of the second thin-film transistor 120. The present invention designs a new type of LTPO structure with a high retaining wall surrounding the oxide semiconductor layer 121. The annular retaining wall is configured to prevent the oxide semiconductor layer 121 from intrusion of water, oxygen, etc., thereby protecting excellent electrical characteristics of devices while significantly enhancing reliability of thin-film transistors, thereby manufacturing a flexible display screen with excellent performance.

Detailed descriptions are as follows. It should be explained that an order of description in the following embodiments is not intended to limit a preferred order of the embodiments.

First Embodiment

As shown in FIG. 1, the display panel 100 provided by a first embodiment of the present invention includes a substrate 101, a first light-shielding layer 105, a second light-shielding layer 106, a thin-film transistor layer 102, a first annular retaining wall 107, a planarization layer 103, a pixel defining layer 108, a support layer 109, a display functional layer 114, an encapsulation layer 115, a touch layer 117, a polarizer 118, and a cover glass 119.

The substrate 101 includes a flexible substrate 1011 and a barrier layer 1012. The flexible substrate 1011 has a function of blocking water and oxygen. The flexible substrate 1011 has better impact resistance and can effectively protect other devices. A material of the flexible substrate 1011 is one or more of polyimide, polycarbonate, polyethylene terephthalate, and polyethylene naphthalate. The barrier layer 1012 is disposed on the flexible substrate 1011. A material of the barrier layer 1012 includes a silicon-based compound, which is configured to block water and oxygen.

The thin-film transistor layer 102 is disposed on the barrier layer 1012. The thin-film transistor layer 102 includes a buffer layer 1021, a gate insulating layer 1022, a first insulating layer 1023, a second insulating layer 1024, and a passivation layer 1025.

The buffer layer 1021 is disposed on the barrier layer 1012. The first light-shielding layer 105 is disposed on the barrier layer 1012 and is covered by the buffer layer 1021. A material of the buffer layer 1021 can be one or more of SiO2 and SiNx.

The gate insulating layer 1022 is disposed on the buffer layer 1021. A material of the gate insulating layer 1022 can be one or more of SiO2 and SiNx. The first insulating layer 1023 is disposed on the gate insulating layer 1022. A material of the first insulating layer 1023 can be one or more of SiO2 and SiNx. The second insulating layer 1024 is disposed on the first insulating layer 1023. A material of the second insulating layer 1024 can be one or more of SiO2 and SiNx. The passivation layer 1025 is disposed on the second insulating layer 1024.

The thin-film transistor layer 102 includes a first thin-film transistor 110 and a second thin-film transistor 120. The first thin-film transistor 110 is a low-temperature polycrystalline silicon thin-film transistor. The second thin-film transistor 120 is an oxide thin-film transistor. The first thin-film transistor 110 and the second thin-film transistor 120 form an LTPO drive structure.

The first thin-film transistor 110 includes a low-temperature polycrystalline silicon semiconductor layer 111, a first gate layer 112, and a first source/drain layer 113.

The low-temperature polycrystalline silicon semiconductor layer 111 is disposed on the buffer layer 1021 and is covered by the gate insulating layer 1022. A material of the low-temperature polycrystalline silicon semiconductor layer 111 includes low-temperature polycrystalline silicon. During manufacturing, a layer of an amorphous silicon material is deposited, and a high temperature curing method, an excimer laser annealing method, or a metal induced crystallization method is adopted to convert amorphous silicon into a polycrystalline silicon layer. Then, a polycrystalline silicon semiconductor layer is formed through a patterning process. The gate insulating layer 1022 is mainly configured to prevent the first gate layer 112 from contacting the low-temperature polycrystalline silicon semiconductor layer 111, which may cause a short circuit. The material of the gate insulating layer 1022 can be one or more of SiO2 and SiNx.

The first gate layer 112 is disposed on the gate insulating layer 1022 and is covered by the first insulating layer 1023. A material of the first gate layer 112 is metal, such as copper (Cu) or molybdenum (Mo).

The first source/drain layer 113 is disposed on the second insulating layer 1024 and is covered by the passivation layer 1025. The first source/drain layer 113 penetrates the second insulating layer 1024, the first insulating layer 1023, and part of the gate insulating layer 1022 down to an upper surface of the low-temperature polycrystalline silicon semiconductor layer 111. The first source/drain layer 113 includes a metal electrode trace 1131. A right end of the metal electrode trace 1131 penetrates the second insulating layer 1024, the first insulating layer 1023, and part of the gate insulating layer 1022 to connect to a left end of the low-temperature polycrystalline silicon semiconductor layer 111. A left end of the metal electrode trace 1131 penetrates the second insulating layer 1024, the first insulating layer 1023, the gate insulating layer 1022, and part of the buffer layer 1021 to connect to a left end of the first light-shielding layer 105.

The second light-shielding layer 106 is disposed on the gate insulating layer 1022 and is covered by the first insulating layer 1023. In the first embodiment, the second light-shielding layer 106 and the first gate layer 112 are disposed in a same layer. A material of the second light-shielding layer 106 is same as the material of the first gate layer 112. The second light-shielding layer 106 and the first gate layer 112 are formed by a same photomask, which means that the second light-shielding layer 106 and the first gate layer 112 are obtained by depositing a metal material and patterning.

The second thin-film transistor 120 includes the oxide semiconductor layer 121, a third insulating layer 122, a second gate layer 123, and a second source/drain layer 124.

The oxide semiconductor layer 121 and the first annular retaining wall 107 are disposed in the same layer on the first insulating layer 1023.

A material of the oxide semiconductor layer 121 includes indium tin zinc oxide (ITZO) or indium gallium zinc oxide (IGZO). The first annular retaining wall 107 surrounds the oxide semiconductor layer 121 of the second thin-film transistor 120. A height of the first annular retaining wall 107 is greater than or equal to a height of the oxide semiconductor layer 121. The first annular retaining wall 107 is configured to prevent the oxide semiconductor layer 121 from intrusion of water, oxygen, etc., thereby protecting excellent electrical characteristics of devices while significantly enhancing reliability of thin-film transistors. A cross-sectional shape of the first annular retaining wall 107 is a symmetrical figure including a square shape (as shown in FIG. 2), a circular shape (as shown in FIG. 3), or a petal shape (as shown in FIG. 4). A material of the first annular retaining wall 107 is same as the material of the oxide semiconductor layer 121. During manufacturing, a layer of an oxide semiconductor material is deposited and then patterned to form the first annular retaining wall 107 and the oxide semiconductor layer 121. This does not add other processes to a new structure. This embodiment does not specifically limit a number of the first annular retaining wall 107. The first annular retaining wall 107 serves as a sacrificial layer around the oxide semiconductor layer 121 and actively absorbs intruding water and oxygen, thereby protecting the oxide semiconductor layer 121.

The third insulating layer 122 is disposed on the oxide semiconductor layer 121 and is mainly configured to prevent the second gate layer 123 from contacting the oxide semiconductor layer 121, which may cause a short circuit. A material of the third insulating layer 122 can be one or more of SiO2 and SiNx.

The second gate layer 123 is disposed on the third insulating layer 122. The second insulating layer 1024 covers the oxide semiconductor layer 121, the second gate layer 123, and the first annular retaining wall 107. The material of the third insulating layer 122 can be one or more of SiO2 and SiNx.

The second source/drain layer 124 is disposed on the second insulating layer 1024 and is covered by the passivation layer 1025. The second source/drain layer 124 includes a first electrode trace 1241 and a second electrode trace 1242. One end (the left end in the figure) of the first electrode trace 1241 penetrates part of the second insulating layer 1024 and is connected to a left end of the oxide semiconductor layer 121. The other end (the right end in the figure) of the first electrode trace 1241 penetrates the second insulating layer 1024, the first insulating layer 1023, and part of the gate insulating layer 1022 to connect to a right end of the low-temperature polycrystalline silicon semiconductor layer 111. The second electrode trace 1242 penetrates part of the second insulating layer 1024 to connect to a right end of the oxide semiconductor layer 121. The second thin-film transistor 120 is connected to the first thin-film transistor 110 through the second source/drain layer 124.

The planarization layer 103 is disposed on the thin-film transistor layer 102 to increase a flatness of the thin-film transistor layer 102.

The first electrode 104 is disposed on the planarization layer 103 and connected to the first thin-film transistor 110. Specifically, the first electrode 104 penetrates the planarization layer 103 and part of the passivation layer 1025 to connect to the metal electrode trace 1131.

The pixel defining layer 108 is disposed on the first electrode 104. The pixel defining layer 108 includes a slot 1081. Part of the first electrode 104 is exposed in the slot 1081. The support layer 109 is disposed on the pixel defining layer 108.

The display functional layer 114 is disposed on part of the first electrode 104 and the support layer 109. The display functional layer 114 includes an organic light-emitting layer and a cathode. The organic light-emitting layer is disposed on part of the first electrode 104 and the support layer 109. The cathode is disposed on the organic light-emitting layer. The organic light-emitting layer 12 described in this embodiment can be an organic electroluminescent layer. A working principle of the organic electroluminescence layer is that when electricity is supplied to an appropriate voltage, positive holes and cathode charge are combined in the organic light-emitting layer and recombine with a certain probability to form excitons (electron-hole pair) in an excited state under an action of Coulomb forces. This excited state is unstable in a normal environment. The excitons in the excited state recombine and transfer energy to a luminescent material to make it transit from a ground state energy level to the excited state. An excited state energy generates photons through a radiative relaxation process, so as to release light energy and generating light. According to different formulas, three primary colors of red, green, and blue are produced to form basic colors.

As shown in FIGS. 1 and 5, the encapsulation layer 115 is disposed on the display functional layer 114. The touch layer 117 is disposed on the encapsulation layer 115 to realize a touch function of the display panel 100. The encapsulation layer 115 includes a first inorganic layer 1151, an organic layer 1152, and a second inorganic layer 1153. The organic layer 1152 is disposed between the first inorganic layer 1151 and the second inorganic layer 1153 to encapsulate and protect the display panel 100.

As shown in FIGS. 1 and 6, the polarizer 118 is disposed on the touch layer 117. The polarizer 118 includes a first triacetyl cellulose (TAC) layer 1181, a polyvinyl alcohol (PVA) layer 1182, and a second TAC layer 1183. The PVA layer 1182 is mainly configured for polarization. Because the PVA layer 1182 is easily hydrolyzed, a first TAC layer 1181 is disposed on one side of the PVA layer 1182, and a second TAC layer 1183 is disposed on the other side of the PVA layer 1182. The PVA layer 1182 takes advantage of high light-transmittance, good water-resistance, and good mechanical strength of the first TAC layer 1181 and the second TAC layer 1183 to protect the PVA layer 1182 and prevent the PVA layer 1182 from being hydrolyzed, thereby increasing physical properties of the polarizer 118.

The cover glass 119 is disposed on the polarizer 118. The cover glass 119 is adhered onto the polarizer 118 by an optical adhesive. The cover glass 119 is mainly configured to protect other film layers of the display panel 100. Other film layers of the display panel 100 can be prevented from decreasing a lifespan due to intrusion of water and oxygen. Other film layers of the display panel 100 are further prevented from breakage and damage from external pressure affecting display effects of the display panel 100.

The display panel 100 provided by the first embodiment of the present invention configures the first annular retaining wall 107 to surround the oxide semiconductor layer 121 of the second thin-film transistor 120. The first annular retaining wall 107 prevents the oxide semiconductor layer 121 from intrusion of water, oxygen, etc., thereby protecting excellent electrical characteristics of devices while significantly enhancing reliability of thin-film transistors. In addition, when forming the oxide semiconductor layer 121 and the first annular retaining wall 107, the material of the first annular retaining wall 107 is configured to be same as the material of the oxide semiconductor layer 121. The first annular retaining wall 107 and the oxide semiconductor layer 121 are formed by a same photomask, which does not add other photomasks to the new structure.

Second Embodiment

As shown in FIG. 7, a second embodiment of the present invention provides a display panel **100*a*, which is different from the structure of the first embodiment in that the display panel 100*a* further includes at least one second annular retaining wall 125*a* surrounding a low-temperature polycrystalline silicon semiconductor layer 111*a*. A cross-sectional shape of the second annular retaining wall 125*a*** is a symmetrical figure including a square shape, a circular shape, or a petal shape.

The second annular retaining wall **125*a* and the low-temperature polycrystalline silicon semiconductor layer 111*a* are disposed in a same layer on a buffer layer 1021*a*. A height of the second annular retaining wall 125*a* is greater than or equal to a height of the low-temperature polycrystalline silicon semiconductor layer 111*a*. The second annular retaining wall 125*a* prevents the low-temperature polycrystalline silicon semiconductor layer 111*a*** from intrusion of water, oxygen, etc., thereby protecting excellent electrical characteristics of devices while significantly enhancing reliability of thin-film transistors.

A material of the second annular retaining wall **125*a* is same as a material of the low-temperature polycrystalline silicon semiconductor layer 111*a*. During manufacturing, a layer of an amorphous silicon material is deposited, and a high temperature curing method, an excimer laser annealing method, or a metal induced crystallization method is adopted to convert amorphous silicon into a polycrystalline silicon layer. Then, a polycrystalline silicon semiconductor layer and the second annular retaining wall 125*a* are formed through a patterning process. This does not add other photomasks to a new structure. This embodiment does not specifically limit a number of the second annular retaining wall 125*a*. The second annular retaining wall 125*a* serves as a sacrificial layer around the low-temperature polycrystalline silicon semiconductor layer 111*a* and actively absorbs intruding water and oxygen, thereby protecting the low-temperature polycrystalline silicon semiconductor layer 111*a***.

Although the present invention has been disclosed above with the preferred embodiments, it is not intended to limit the present invention. Persons having ordinary skill in this technical field can still make various alterations and modifications without departing from the scope and spirit of this invention. Therefore, the scope of the present invention should be defined and protected by the following claims and their equivalents.

What is claimed is:

1. A display panel, comprising:

a substrate;

a thin-film transistor layer disposed on the substrate and comprising a first thin-film transistor and a second thin-film transistor, wherein the first thin-film transistor comprises a low-temperature polycrystalline silicon semiconductor layer, and the second thin-film transistor comprises an oxide semiconductor layer;

at least one first annular retaining wall surrounding the oxide semiconductor layer;

a first insulating layer disposed on the substrate, wherein the oxide semiconductor layer and the first annular retaining wall are disposed in a same layer on the first insulating layer, and a material of the oxide semiconductor layer and a material of the first annular retaining wall are same;

a buffer layer disposed on the substrate, wherein the low-temperature polycrystalline silicon semiconductor layer is disposed on the buffer layer;

at least one second annular retaining wall surrounding the low-temperature polycrystalline silicon semiconductor layer;

a gate insulating layer disposed on the buffer layer and covering the low-temperature polycrystalline silicon semiconductor layer and the second annular retaining wall; and a first gate layer disposed on the gate insulating layer and covered by the first insulating layer;

wherein the first insulating layer is disposed between the first gate layer and the oxide semiconductor layer.

2. The display panel according to claim 1, wherein a cross-sectional shape of the first annular retaining wall is a symmetrical figure comprising a square shape, a circular shape, or a petal shape.

3. The display panel according to claim 1, wherein a height of the first annular retaining wall is greater than or equal to a height of the oxide semiconductor layer.

4. The display panel according to claim 1, wherein the low-temperature polycrystalline silicon semiconductor layer and the second annular retaining wall are disposed in a same layer on the buffer layer, and a material of the low-temperature polycrystalline silicon semiconductor layer and a material of the second annular retaining wall are same.

5. The display panel according to claim 1, further comprising:

a second insulating layer disposed on the first insulating layer;

a third insulating layer disposed on the oxide semiconductor layer; and a second gate layer disposed on the third insulating layer, wherein the second gate layer, the oxide semiconductor layer, and the first annular retaining wall are covered by the second insulating layer.

6. The display panel according to claim 5, further comprising:

a first source/drain layer disposed on the second insulating layer and penetrating the second insulating layer, the first insulating layer, and part of the gate insulating layer down to an upper surface of the low-temperature polycrystalline silicon semiconductor layer;

a second source/drain layer disposed on the second insulating layer and penetrating part of the second insulating layer to connect to the oxide semiconductor layer; and a passivation layer disposed on the second insulating layer and covering the first source/drain layer and the second source/drain layer.

7. The display panel according to claim 1, further comprising:

a first light-shielding layer disposed on the substrate and covered by the buffer layer; and a second light-shielding layer disposed on the gate insulating layer and covered by the first buffer layer.

* * * * *